(12) United States Patent
Sandell et al.

(10) Patent No.: US 11,177,831 B2
(45) Date of Patent: Nov. 16, 2021

(54) LLR ESTIMATION FOR SOFT DECODING

(71) Applicants: Kabushiki Kaisha Toshiba, Minato-ku (JP); Kioxia Corporation, Minato-ku (JP)

(72) Inventors: Magnus Stig Torsten Sandell, Bristol (GB); Amr Ismail, Bristol (GB)

(73) Assignees: Kabushiki Kaisha Toshiba, Minato-ku (JP); Kioxia Corporation, Minato-ku (JP)

( * ) Notice: Subject to any disclaimer, the term of this patent is extended or adjusted under 35 U.S.C. 154(b) by 0 days.

(21) Appl. No.: 16/843,934

(22) Filed: Apr. 9, 2020

(65) Prior Publication Data

US 2021/0320676 A1 Oct. 14, 2021

(51) Int. Cl.
*H03M 13/11* (2006.01)
*H03M 13/39* (2006.01)
*H03M 13/37* (2006.01)
*G06N 3/04* (2006.01)
*H03M 13/00* (2006.01)
*G06K 9/62* (2006.01)

(52) U.S. Cl.
CPC ....... *H03M 13/1111* (2013.01); *G06K 9/6256* (2013.01); *G06N 3/04* (2013.01); *H03M 13/3738* (2013.01); *H03M 13/3927* (2013.01); *H03M 13/6577* (2013.01)

(58) Field of Classification Search
CPC .................................................. H03M 13/1111
See application file for complete search history.

(56) References Cited

U.S. PATENT DOCUMENTS

| | | | |
|---|---|---|---|
| 2015/0242268 A1 | 8/2015 | Wu et al. | |
| 2016/0277041 A1 | 9/2016 | Zhang et al. | |
| 2018/0343017 A1* | 11/2018 | Kumar | G06N 3/0454 |
| 2018/0357530 A1* | 12/2018 | Beery | G06N 3/0454 |
| 2018/0358988 A1* | 12/2018 | Sharon | H03M 13/255 |
| 2019/0068220 A1* | 2/2019 | Kumar | G06F 12/0246 |
| 2019/0149169 A1* | 5/2019 | Chang | H03M 13/1108 |
| | | | 714/752 |
| 2020/0099401 A1* | 3/2020 | Qin | G06N 3/08 |

OTHER PUBLICATIONS

Sharon et al., "Dynamic Memory Error Model Estimation for Read and ECC Adaptations", Non-Volatile Memory Workshop, Western Digital, Mar. 2017, 2 pages.

* cited by examiner

*Primary Examiner* — Joseph D Torres
(74) *Attorney, Agent, or Firm* — Oblon, McClelland, Maier & Neustadt, L.L.P.

(57) ABSTRACT

A method of soft decoding received signals. The method comprising defining quantisation intervals for a signal value range, determining a number of bits in each quantisation interval that are connected to unsatisfied constraints, providing, the number of bits in each quantisation interval that are connected to unsatisfied constraints, as an input to a trained model, wherein the trained model has been trained to cover an operational range of a device for soft decoding of signals, determining, using the trained model, a log likelihood ratio for each quantisation interval, and performing soft decoding using the log likelihood ratios.

15 Claims, 10 Drawing Sheets

LLR ESTIMATION FOR SOFT DECODING

FIELD

Embodiments described herein relate generally to reading received signal values and in particular to a method of soft decoding received signal values.

BACKGROUND

Error-correcting codes (ECC) are often used in communications and storage applications to protect the data against detection/reading errors. Although there are many types of ECC, most of them work better if, as part of their decoding an indication of the level of reliability of the decoding is provided instead of simply a binary decoding decision. In some case, it is possible to compute an indication of decoding reliability based on the system model. However, in other cases, the system model is too complicated to allow such computation to be performed at all or at least in an efficient manner.

In the following, embodiments will be described with reference to the drawings in which.

DETAILED DESCRIPTION

According to an embodiment there is provided a method of soft decoding received signals. The method comprises defining quantisation intervals for a signal value range, determining a number of bits in each quantisation interval that are connected to unsatisfied constraints, providing, the number of bits in each quantisation interval that are connected to unsatisfied constraints, as an input to a trained model, wherein the trained model has been trained to cover an operational range of a device for soft decoding of signals, determining, using the trained model, a log likelihood ratio for each quantisation interval, and performing soft decoding using the log likelihood ratios.

In an embodiment the device is a flash memory device, and the trained model has been trained on a dataset acquired for a range of data retention intervals, program/erase cycles, read/disturb values and temperature values for the flash memory device.

In an embodiment, the step of determining the log likelihood ratio for each quantisation interval comprises inferring, from the trained model, a magnitude of a log likelihood ratio for each quantisation interval, and calculating, using the magnitude of the log likelihood ratio, the log likelihood ratio in each quantisation interval.

In an embodiment, the method may further comprise determining a number of bits in each quantisation interval, wherein determining the log likelihood ratio for each quantisation interval comprises inferring, from the trained model, an error in each quantisation interval and determining a magnitude of a log likelihood ratio for each quantisation interval based on the error and the number of bits detected in each quantisation interval. The method further comprising calculating, using the magnitude of the log likelihood ratio, the log likelihood ratio in each quantisation interval.

In an embodiment the trained model is a neural network.

In an embodiment the method further comprises outputting the soft decoded data from a controller that has performed said soft decoding to an output port or to a connected device.

According to an embodiment there is provided a non-transitory storage medium storing computer program instructions for execution by a processor and that, when executed by a processor, cause the processor to perform any of the above discussed methods.

According to an embodiment there is provided a device for soft decoding received signals. The device comprises a processor and memory storing instructions for execution by the processor, the instruction causing the processor when executing the instruction to define quantisation intervals for a signal value range, determine a number of bits in each quantisation interval that are connected to unsatisfied constraints, provide, the number of bits in each quantisation interval that are connected to unsatisfied constraints, as an input to a trained model wherein the trained model has been trained to cover an operational range of a device for soft decoding of signals, determine, using the trained model, a log likelihood ratio for each quantisation interval, and perform soft decoding using the log likelihood ratios.

In an embodiment the device is a flash memory device, and the trained model has been trained on a dataset acquired for a range of data retention intervals, program/erase cycles, read/disturb values and temperature values for the flash memory device.

In an embodiment, the step to determine the log likelihood ratio for each quantisation interval comprises infer, from the trained model, a magnitude of a log likelihood ratio for each quantisation interval, and calculate, using the magnitude of the log likelihood ratio, the log likelihood ratio in each quantisation interval.

In an embodiment, the instructions cause the processor when executing the instruction to determine a number of bits in each quantisation interval, wherein determine the log likelihood ratio for each quantisation interval comprises infer, from the trained model, an error in each quantisation interval, and determine a magnitude of a log likelihood ratio for each quantisation interval based on the error and the number of bits detected in each quantisation interval. The instructions further cause the processor when executing the instruction to calculate, using the magnitude of the log likelihood ratio, the log likelihood ratio in each quantisation interval.

In an embodiment, the trained model is a neural network.

In an embodiment, the instructions cause the processor when executing the instructions to output the soft decoded data from a controller that has performed said soft decoding to an output port or to a connected device.

In an embodiment, the device is a flash memory storage device.

In an embodiment, the device is a wireless communications device.

Figure 1:
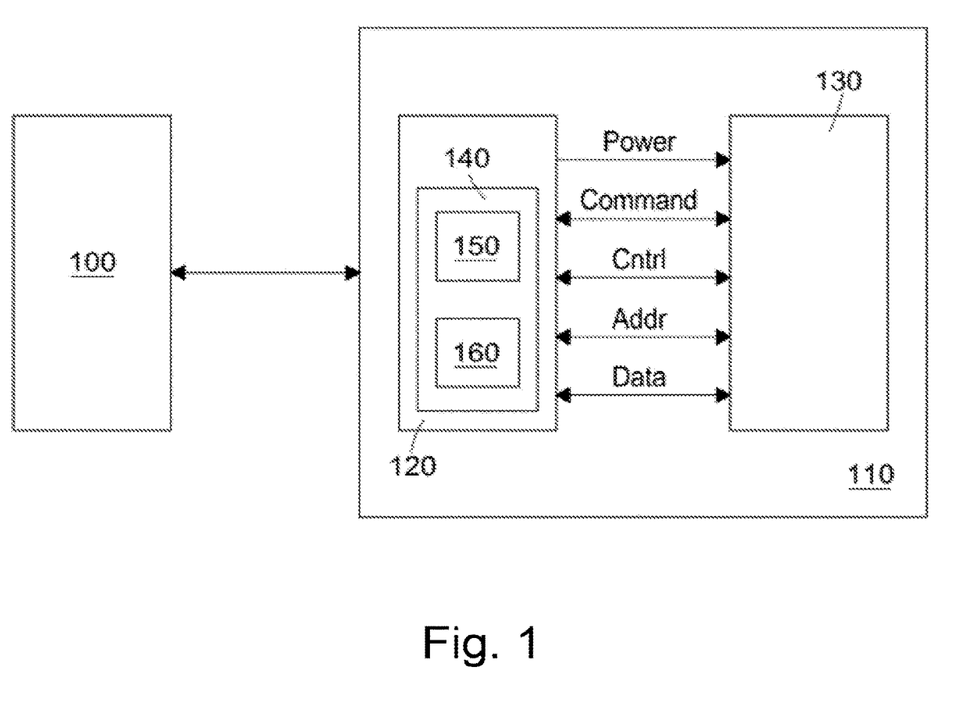
FIG. 1 shows a system that comprises a computing device and a non-volatile flash storage memory.

FIG. 1 shows a system that comprises a computing device 100 and non-volatile flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile flash storage memory 110 may take any form of non-volatile storage device comprising flash memory. The non-volatile flash storage memory 110 may, for example, be a "thumb drive", a solid-state drive (SSD), a memory card, etc.

The computing device 100 and the non-volatile flash storage memory 110 are in communicative connection with each other in a manner that allows the computing device 100 to transmit data and commands indicating the processing the data is to be subjected to by the non-volatile flash storage memory 110 to the non-volatile flash storage memory 110 and that allows the non-volatile flash storage memory 110 return data retrieved from memory to the computing device 100. The computing device 100 may also provide power to the non-volatile flash storage memory 110. A number of interfaces that allow communication between a computing device 100 and a non-volatile flash storage memory 110 are known. The exact nature of the interface is not important. Exemplary interfaces include the USB interface, SD, microSD, xD, Compactflash, MMC, to name but a few.

The non-volatile flash storage memory 110 comprises a memory controller 120 and non-volatile flash memory 130. The memory controller 120 interfaces with the computing device 100 as well as with the flash memory 130. The memory controller 120 provides power to the flash memory 130 and is moreover connected to the flash memory 130 via command, control, address and data lines. The memory controller 120 may control all of the operations flash memory 130.

Figure 2:
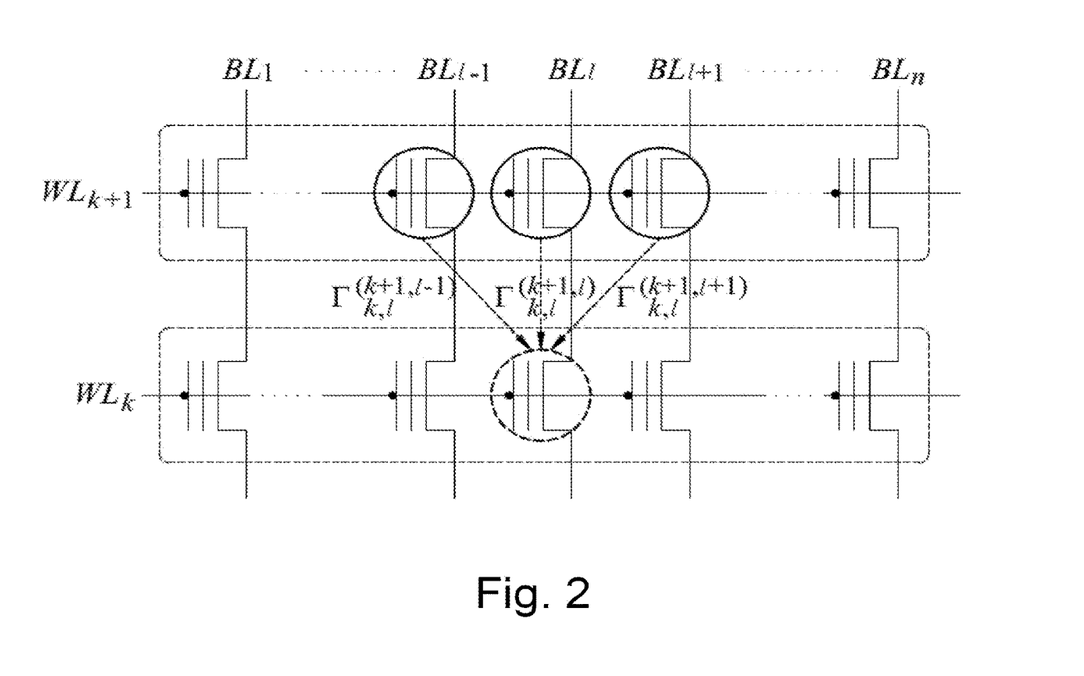
FIG. 2 shows an architecture of memory cells within a flash array.

As shown in FIG. 2, memory cells in NAND flash memory consist of field effect transistors that comprise a floating gate interposed between the FET's gate and channel. NAND flash memory cells are organised into multiple blocks. Memory cells within each block are arranged horizontally along word-lines (for example around 32-64 word lines per block; in FIG. 2 two word lines, $WL_{k+1}$ and $WL_k$ are shown) that connect the gates of horizontally adjacent FETs, and vertically along (often thousands of) bit-lines ($BL_1$ to $BL_n$ in FIG. 2), connecting drains and sources of vertically adjacent FETs. The control gates of all the cells along a word-line are connected to the address bus while the drains of the cells along a bit-line are connected to the data bus. The unit for read/write operations is the word-line, whereas erasure is applied block-wise.

To determine the storage state of a memory cell a bias voltage is applied to the word line connected to the memory cell in question and a separate bias voltage is applied across the memory cell's channel. The gate voltage applied to all other memory cells that are connected to the memory cells that is to be read is such that the other memory cells are fully conducting so that the bias voltage applied along the bitline is applied, to the largest extent possible, across the channel of the memory cell to be read.

Figure 3A:
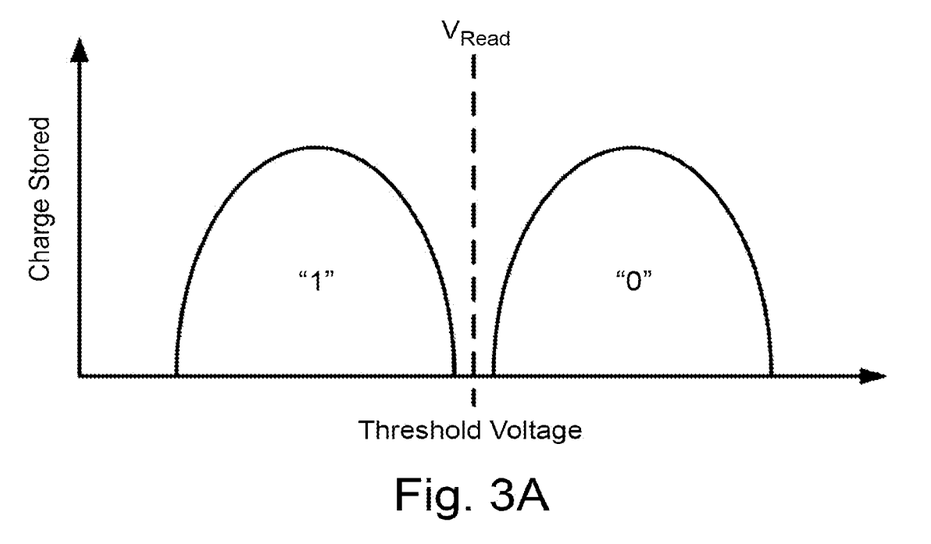
FIG. 3A shows the potential storage states of a memory cell that can store a single bit.

FIG. 3A shows the potential storage states of a memory cell can store a single bit. The abscissa represents the threshold voltage applied to the gate of the memory cell. If a threshold voltage falling between the two storage states (the storage state indicated by "1" is the erased state of the memory cell in may be associated with a logical "1" while the storage state indicated by "0" is the program state of the memory cell in may be associated with a logical "0", although the mapping of storage state to logical information can be reversed) is applied to the gate then the memory cells conducting if the floating gate stores charges falling within the boundary of the "0" storage state and non-conducting if the floating gate stores charges falling within the boundary of the "1" storage state. Thus, by detecting the current flowing memory cell the storage state of the memory cell can be determined. It is to be noted that memory cells that store more than one bit per memory cell are known. Such memory cells require $2^n$ storage distributions (with n being the number of bits stored). The two distributions shown in FIG. 3A are distributions of a plurality of memory cells within the two storage states.

The conductivity of the channel of the memory cell to be read is intended to be influenced solely by the amount of charge stored on the memory cell's floating gate and by the bias voltage (indicated as $V_{Read}$ in FIG. 3A) applied to the gate of the memory cell. The source-drain current that can be sensed as flowing through the channel of/along the bit line connected to the memory cell allows concluding whether the amount of charge stored by the memory cell is above or below an amount required for rendering the channel of the memory cell conductive for a given gate bias voltage. If the flash array is configured to store more than one bit per memory cell, that is if the memory cell has the potential to define more than two memory storage states then a read threshold voltage may have to be applied between every pair of adjacent storage states.

To store charges in the floating gate of a memory cell charges are progressively injected into the floating gate using incremental step pulse program (ISPP). The amount of charge stored on the floating gate is monitored (for example using the above discussed sensing technique) to keep track of programming progress. Once it is determined that a charge that is sufficient to render the memory cell conductive for a given threshold voltage has been stored in a floating gate of the memory cell programming is completed.

It is worth noting that programming is a one-way process in a sense that the amount of charge stored on the floating gate cannot selectively be reduced. Instead, once the amount of charge stored in a memory cell exceeds a desired amount all of the charges on the memory cell need to be removed from the floating gate and programming re-started. Such erasure takes place simultaneously for all memory cells in a block of flash memory.

Figure 3B:
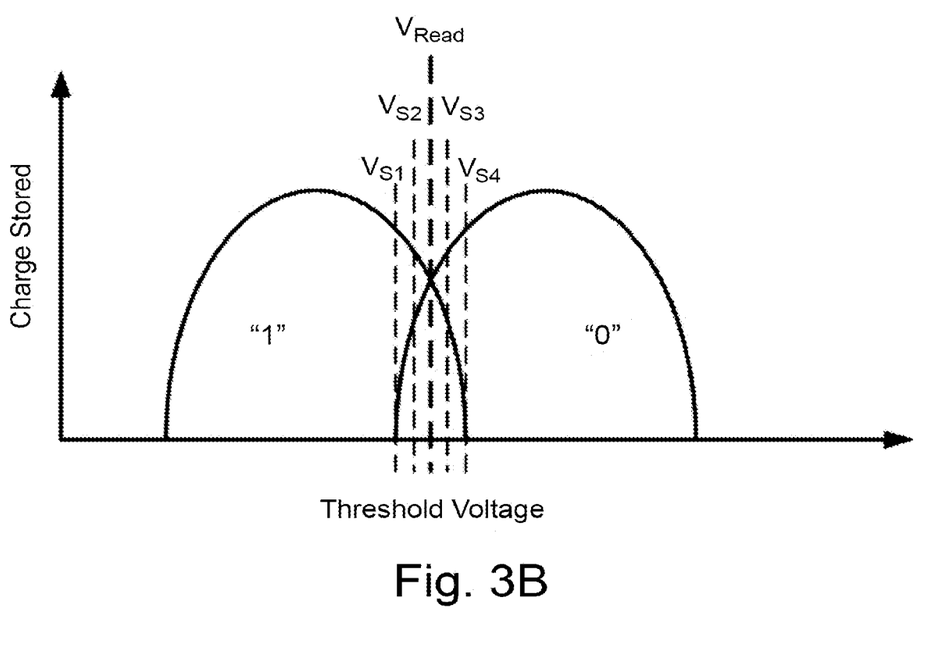
FIG. 3B shows the application of a number of read voltages during reading of a memory cell's storage state.

NAND flash memory cells are subject to various types of impairments that affect its performance, such as inaccurate programming, retention noise, random telegraph noise and more importantly inter-cell interference (ICI). It will be appreciated that charges stored on the floating gate generate electric fields that can influence the conductivity of the channel of an adjacent memory cell, thereby interfering with and potentially falsifying perceived memory cell storage state. This is illustrated in FIG. 3B. It will be appreciated that, even if the threshold voltage $V_{Read}$ is chosen it is still possible for programmed memory cells that happen to fall within the leftmost part of the "0" charge distribution to not be able to cause the memory cell to conduct. These memory cells are then incorrectly interpreted as relating to storage state "1". Conversely it is also possible for an erased memory cells that happen to fall within the rightmost part of the "1" charge distribution to cause the memory cell to conduct during a read operation so that these memory cells are being incorrectly interpreted as relating to storage state "0". As flash memory architectures continue to be miniaturised the effect electric fields have on adjacent cells becomes more pronounced, thereby increasing ICI.

One way of mitigating the increasing ICI effect is to employ soft-decision error correction codes (ECCs). Towards this purpose, a flash memory controller may start by comparing the threshold voltage against the hard decision boundaries. If sensing of the storage states of memory cells using hard decision boundaries soft decoding may instead be used. Error correction codes to which soft decoding can be applied include a LDPC (low-density parity check) code, aBCH code, a turbo code, an RS (Reed-Solomon code), a convolution code, an RSC (Recursive Systematic Code), or coded modulation such as TCM (Trellis-Coded Modulation), BCM (Block Coded Modulation), and so on. Soft deciding algorithms that can be used include, amongst others, mini-sum algorithms and Viterbi decoding. For soft decoders to work in the best possible way they require knowledge of the reliability of (e.g., log-likelihood ratios (LLRs)) of the read information to be fed to the iterative decoder. As the channel model is not precisely known, it is desirable to have a simple and dynamic LLR estimation algorithm instead of relying on precomputed lookup table that may undermine the performance the soft detection method.

Some flash memory arrays may be configured to perform an initial 'hard detection' routine in an attempt to determine the storage states of a group of memory cell by simply distinguishing between the stored states using the above described reading process. Any errors encountered are corrected using error correction codes that have originally been stored with the data that is to be read. In such a hard detection routine the threshold voltage used for distinguishing between two storage states may be changed in subsequent read attempts until a threshold voltage that minimises the total number of errors in the read group of cells is found. FIG. 3B illustrates this. In a first read operation threshold voltage $V_{Read}$ shown in FIG. 3B may be used. If the charge distributions of the group of memory cells are as shown in FIG. 3B then the use of this threshold voltage may provide a reading with no or a minimal number of errors. The flash memory may be configured to attempt to perform additional readings of the storage states of the group of memory cells using other threshold voltages that are higher or lower than $V_{Read}$. Such alternative threshold voltages are shown as $V_{S1}$, $V_{S2}$, $V_{S3}$ and $V_{S4}$ in FIG. 3B. The number of errors detected for the group of memory cells using the various read voltages may be compared and the read result that delivers the fewest errors may be chosen for further processing. If the number of errors is low enough to allow the error correction codes stored with the read data to correct these errors then such correction takes place and no further efforts have to be expended on correcting the data.

It will be appreciated that moving the threshold voltage between reads, for example from $V_{Read}$ to $V_{S2}$, the number of memory cells that have been detected as having one of the storage states, say the number of memory cells detected to be in the left-most storage state (mapped to a binary "1" in FIG. 3B) when the threshold voltage $V_{Read}$ is used, is higher than the number of memory cells detected to be in this storage state when threshold voltage $V_{S2}$ is used. Equally, the number of memory cells that have been detected as having the other one of the storage states, in the example the number of memory cells detected to be in the right-most storage state (mapped to a binary "0" in FIG. 3B) when the threshold voltage $V_{Read}$ is used, is lower than the number of memory cells detected to be in this storage state when threshold voltage $V_{S2}$ is used. In the following the intervals defined by respective adjacent threshold voltages are referred to as quantisation intervals r. The total number of quantisation intervals will be referred to as L in the following and has to be equal to or larger than $2^n$, where n is the number of bits per cell. Further quantisation intervals are below threshold voltage $V_{S1}$ and above $V_{S4}$, so that L=6 in the embodiment illustrated in FIG. 3B. Whilst the creation of the quantisation intervals has been described as a result of a hard read algorithm it is envisaged that, if desired or required, further read operations using threshold voltage values to create further quantisation intervals are performed in embodiments.

ECC decoder soft input information can be provided in the form of log likelihood ratio (LLR) information. The LLR is defined as $$LLR = \log \frac{Pr(b=1|y)}{Pr(b=0|y)},$$

where b is the data bit and y is the received (read) value, so, for a given quantisation interval r, that Pr(b=1|y) is the probability of a data bit that has been stored as b=1 being read as a value y and Pr(b=0|y) is the probability of a data bit that has been stored as b=0 being read as a value y. If these conditional probabilities can't be explicitly calculated, a measurement-based technique can be used. As disclosed in, for example, Eran Sharon and Alex Bazarsky (Eran Sharon and Alex Bazarsky, "Dynamic memory error model estimation for real and ECC adaptations", Non-Volatile Memory Workshop, March 2017) it can be shown that the magnitude of the LLR is related to the bit-error rate (BER). In particular for a received value in quantisation interval r, the LLR magnitude is $$|L_r| = \log \frac{1-P_r}{P_r}$$

where $P_r$ is me BER for that particular interval. It is therefore desirable to estimate the interval-dependent BER $P_r$.

Figure 4:
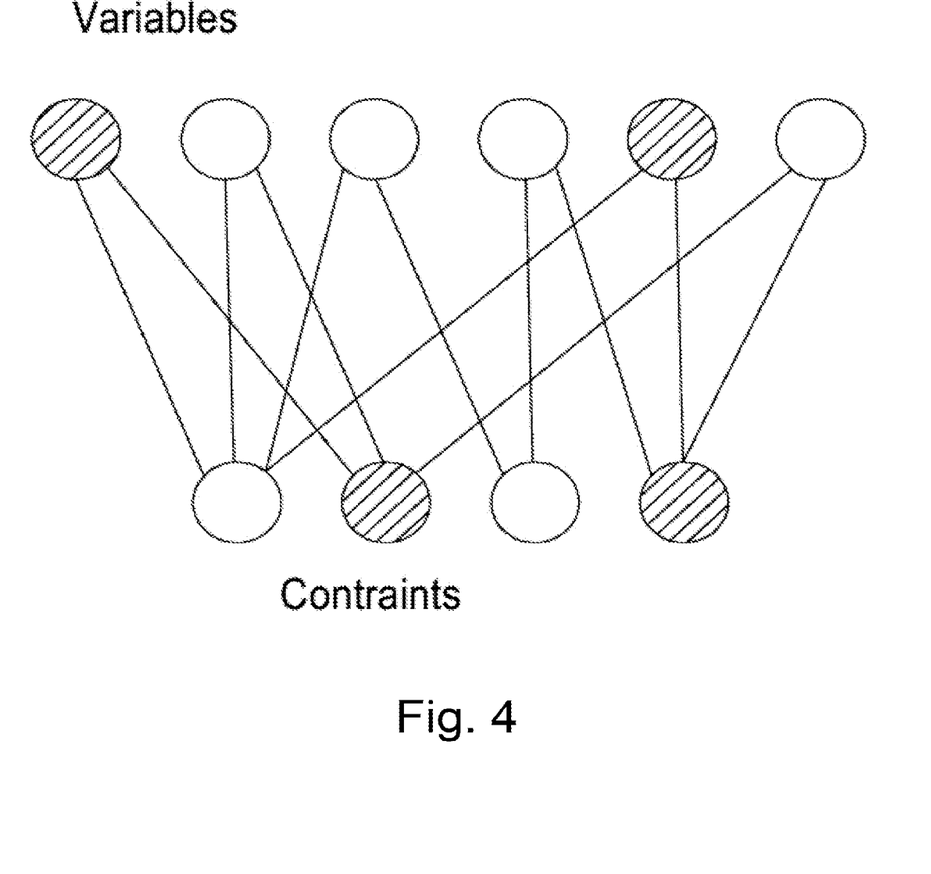
FIG. 4 shows an example LDPC code.

Consider a subsection of a regular LDPC code shown in FIG. 4. The variable nodes shown as the upper row of nodes in FIG. 4 hold the bit information to be corrected/decoded using the LDPC code. The constraint nodes shown as the lower row of nodes in FIG. 4 specify a method of combining the information provided to them by the variable nodes connected to the constraint nodes in the manner shown by the lines of FIG. 4. Let the number of bits received in quantisation interval r that are connected to q unsatisfied constraints be denoted by $C_{r,q}$ and the number of bits received in quantisation interval r by $C_r$. The expected value of the former can be expressed as:

$$E\{C_{r,q}\}=(P_{q|e}P_r+P_{q|c}(1-P_r))C_r=(P_{q|e}-P_{q|c})E_r+P_{q|c}C_r \quad (1)$$

where $E_r$ is the number of bit errors in interval r, $P_{q|e}$ and $P_{q|c}$ are the probabilities that a bit is connected to q unsatisfied constraints given that it is wrong and correct, respectively. Assuming independence of bits connected to the same constraint (which roughly holds for high-girth LDPC codes), these probabilities can be expressed as:

$$P_{q|e} = \binom{d_v}{q} p_{u|e}^q (1-p_{u|e})^{d_v-q} \quad (2)$$

-continued $$P_{q|c} = \binom{d_v}{q} p_{u|c}^q (1-p_{u|c})^{d_v-q} \quad (3)$$

where $p_{u|e}$ and $P_{u|c}$ are the probabilities that a constraint is unsatisfied given that a certain bit is wrong and correct, respectively, and $d_v$ is the variable degree of the LDPC code. These probabilities are founds as:

$$p_{u|e} = \frac{1+(1-2p)^{d_c-1}}{2} \quad (4)$$

$$p_{u|c} = \frac{1-(1-2p)^{d_c-1}}{2} \quad (5)$$

where p is the overall (interval-independent) BER and is the constraint degree of the LDPC code. The overall BER is related to the interval-dependent errors by a simple summation:

$$p = \frac{1}{N}\sum_{r=1}^{L} E_r \quad (6)$$

where N is the total number of bits and L is the number of quantisation intervals. Through the observations $\hat{C}_{r,q}$, $\hat{C}_r$ and the variable dependencies, we have:

$$\hat{C}_{r,q} = (P_{q|e}(E_r) - P_{q|c}(E_r))E_r + P_{q|c}(E_r)\hat{C}_r \quad (7)$$

In the above calculations, we assumed a regular LDPC code (all variable and constraint nodes have the same degree). If an irregular code is used, the same procedure applies but will then have to be repeated for every type of node degree.

Determining the errors $E_r$, and hence $$P_r = \frac{E_r}{C_r}$$

is a very complex optimisation task since $E_r$ affects the probabilities $P_{q|e}$, $P_{q|c}$ in a highly non-linear fashion.

Instead of performing a complicated minimisation, in an embodiment a model is used to determine the errors $E_r$, or the LLR magnitude $|L_r|$. More particularly, a trained model is generated using machine learning algorithms. The parameters of the model are then stored in the flash memory controller which is embedded either in the flash memory device itself or in another device. On input of the values $C_{r,q}$ to the model, the model infers a value for the error $E_r$, denoted $\hat{E}_r$, which is then used in the calculation of the LLR. Alternatively, on input of the values $C_{r,q}$ to the model, the model infers a value for the LLR magnitude $|L_r|$, denoted $|\widehat{L_r}|$, , which is then used in the calculation of the LLR.

Figure 5:
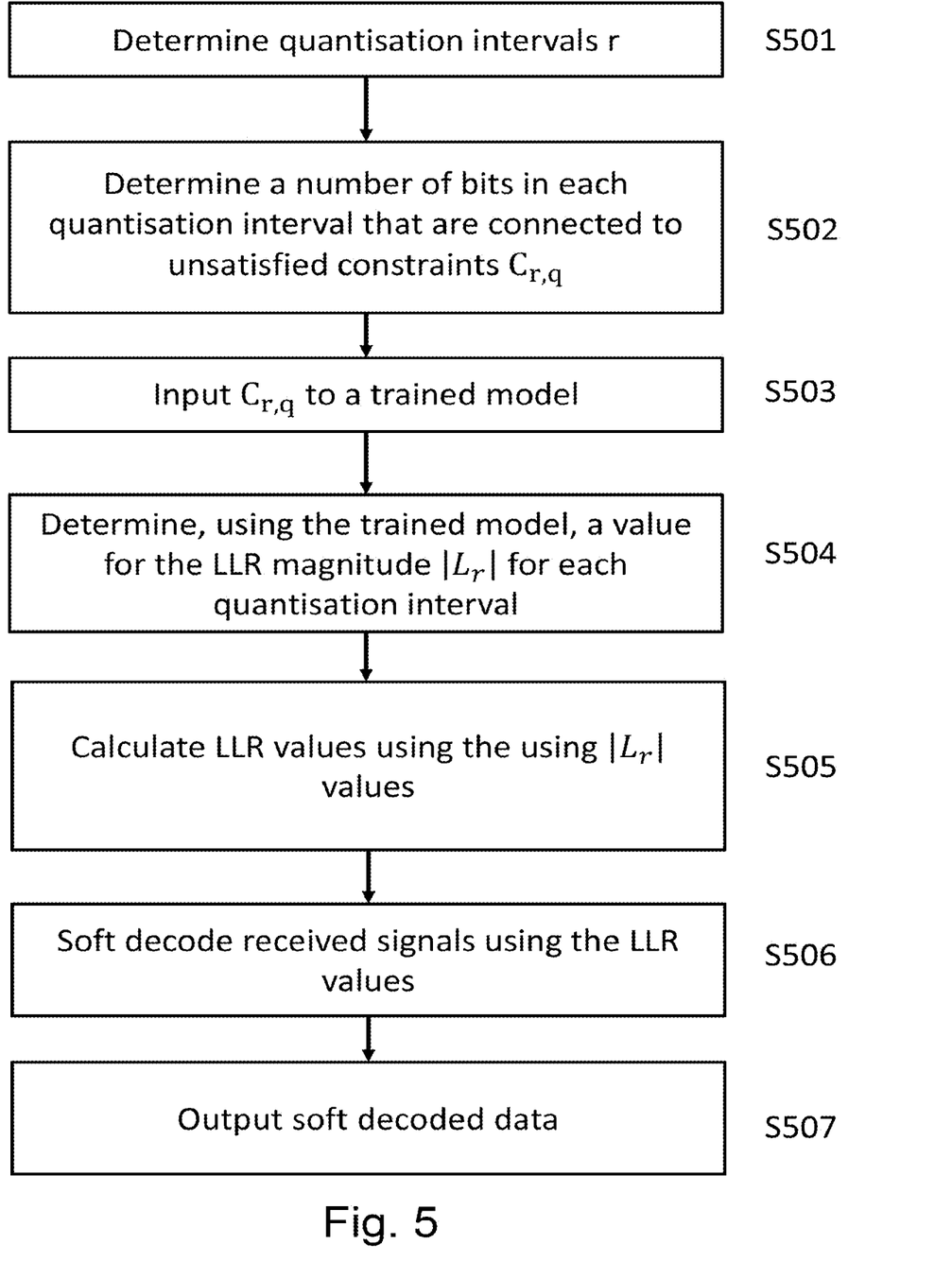
FIG. 5 is a flow chart showing an algorithm of an embodiment.

FIG. 5 illustrates a method according to an embodiment. In S501, quantisation intervals r for a signal value range are determined. Many methods for determining the quantisation intervals are known in the art. Any of these methods may be implemented in step S501. For example, the method employed in U.S. application Ser. No. 16/206,148 may be used. The quantisation intervals may be defined by hard and/or soft thresholds. Advantageously, the proposed method does not rely on the values of the thresholds that define the quantisation intervals.

In S502, a number of bits in each quantisation interval that are connected to unsatisfied constraints $C_{r,q}$ is determined. This number is counted when the memory is read by the flash memory controller during an ECC process.

In S503, the value $C_{r,q}$ is provided as an input to the model. An example of one model that can be used for this purpose is discussed further below.

In S504, a value for the LLR magnitude $|L_r|$ is determined using the model. This may be achieved by directly inferring a value for $|L_r|$, denoted $|\widehat{L_r}|$, , from the model. Alternatively, the model infers a value for the error $E_r$, denoted $\hat{E}_r$. The $|L_r|$ is then calculated using the inferred error $\hat{E}_r$ and the number of bits in each quantisation interval $C_r$, along with equations $$p_r = \frac{E_r}{C_r}$$

and $$|L_r| = \log\frac{1-p}{p}.$$

In this case, the number of bits in each quantisation interval $C_r$ may be calculated along with $C_{r,q}$ in step S502.

In S505, the LLR value is computed. For example, the final LLR is formed as $L_r=(2\hat{b}-1)|L_r|$ where $\hat{b}$ is the hard decision on the bit and the reliability $|L_r|$ has been estimated by the machine learning. The determination of the hard decision is discussed in further detail below.

In S506, soft decoding of received signals can be performed using the LLR values.

In S507, the soft decoded data is output, for example, from a flash memory controller that has performed the soft decoding, to an output port or to a connected device.

In an embodiment, to generate the model, an offline test or series of tests, are conducted to generate a training data set that covers the operational range of the flash memory device. For example, the test may involve taking offline measurements for a range of data retention intervals, program/erase (P/E) cycles, read-disturb, and/or temperature values.

Erasing and writing to the flash memory deteriorates it and, over time, the error performance will get worse. This is known as wear-out and can be quantified by reading memory that has been erased and written to many times (many P/E cycles). If a flash memory is classified as being useful up to, e.g., 3000 P/E cycles, the test would involve reading data at various P/E cycle counts (100, 200, . . . , 3000) to generate the training data set.

Another source of deterioration is when the memory is read many times. This causes the cells (and their neighbours) to change the value slightly and if the memory is read a large number of times, the performance can deteriorate. This is known as read-disturb. In this case, if there is a large time between writing and reading the memory, the content can change as charge from the cells can leak into other cells. To account for this, the test may involve reading the memory may be at intervals, e.g., 1, 2, . . . , 1000 days to generate the training data set, as in data retention tests This process can be sped up by applying an acceleration test. Flash data retention is known to degrade with exposure to elevated temperature. An acceleration test involves "baking" the flash memory chips by heating them up in an oven. By testing the device under accelerated environments for short periods, the behaviour under normal conditions for longer periods can be predicted. This allows for the physical effects the passage of time has on the memory cells storing charges to be emulated in a shorted time.

During each test, a number of samples consisting of $C_{r,q}$ and the corresponding $E_r$ are acquired by writing known data to the memory device and counting the errors. Optionally, the magnitude of the LLR values, $|L_r|$, may be calculated using $$p_r = \frac{E_r}{C_r}$$

and $$|L_r| = \log\frac{1-p}{p}.$$

Figure 6:
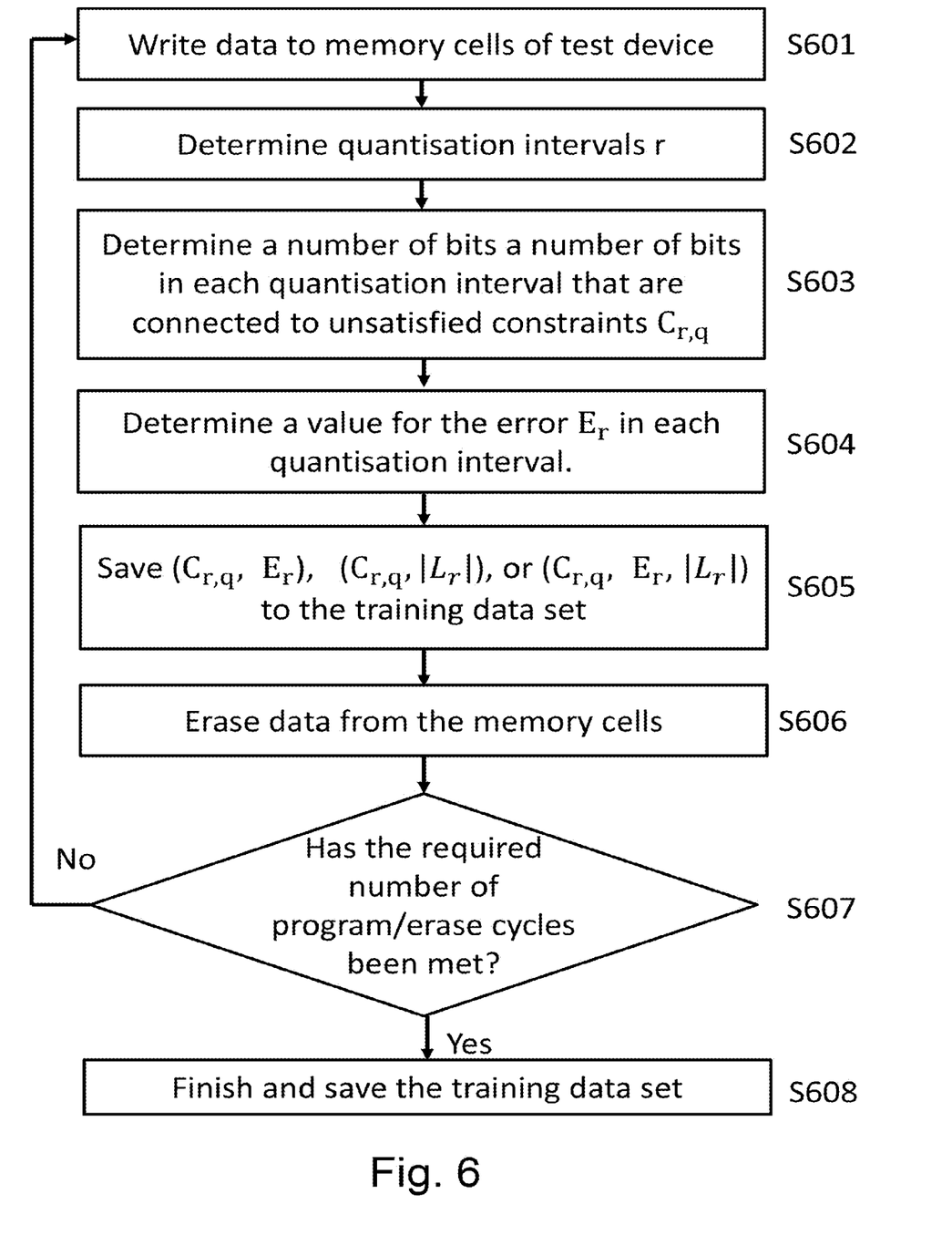
FIG. 6 is a flow chart showing an algorithm of an embodiment.

These tests, either individually or combined together, generate a training dataset that covers a range of operational conditions of the memory device. By training a model based on such a dataset, the model itself encompasses multiple operational conditions that may affect the accuracy of read/write operations to/from the memory device. FIG. 6 illustrates an example method of acquiring the training data set according to an embodiment. While in FIG. 6, a program/erase test is conducted, a similar method may be used for other tests, such as those detailed previously.

In S601, known data is written to the cells of a memory device, for example, a flash memory device.

In S602, quantisation intervals r for a signal value range are determined, as detailed previously.

In S603, a number of bits in each quantisation interval that are connected to unsatisfied constraints $C_{r,q}$ are determined.

In S604, the error $E_r$ in each quantisation interval is determined. As it is known what was written to the cells of the memory device, the errors can be counted.

In S605, the values for $C_{r,q}$ and $E_r$ and/or $|L_r|$ are stored as a data pair or triple in the training data set.

In S605, the data in the cells is erased.

In S607, a check is performed to determine if the number of program/erase cycles has been met. As detailed previously, this number may vary, but it could be up to multiple thousands of cycles. If the number has not been met, steps S601 to S606 are repeated.

The training data set can now be used as the training input ($C_{r,q}$) with the corresponding target ($E_r$ or $|L_r|$) for the model. Any type of machine learning can be used such as neural networks, Support Vector Machines or Decision Trees. The parameters of the model can be changed until a good prediction of $E_r$ or $|L_r|$ is obtained for every input $C_{r,q}$.

Figure 7A:
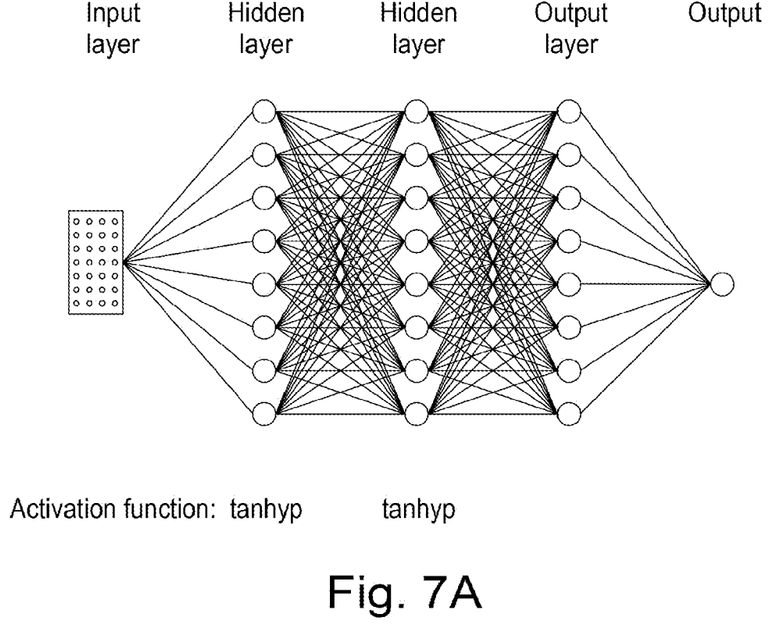
FIG. 7A is an example neural network an embodiment.
Figure 7B:
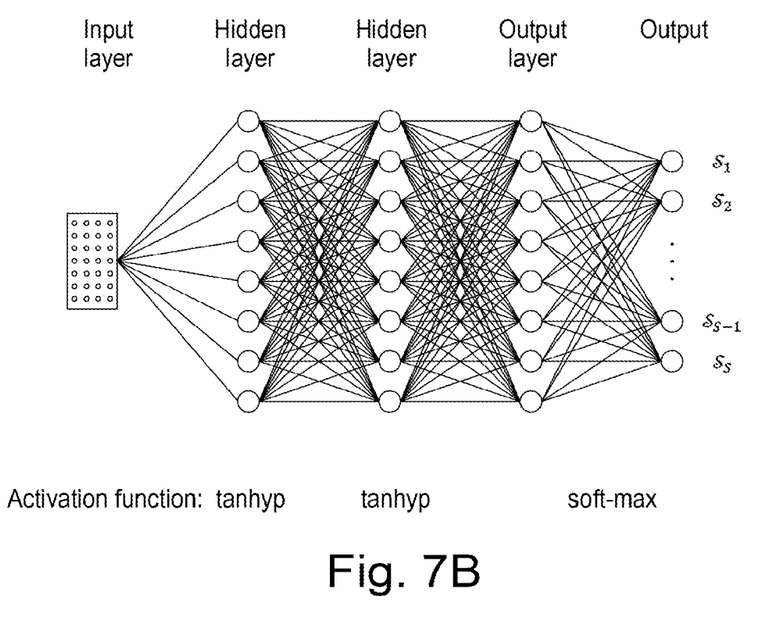
FIG. 7B is an example neural network an embodiment.
Figure 8:
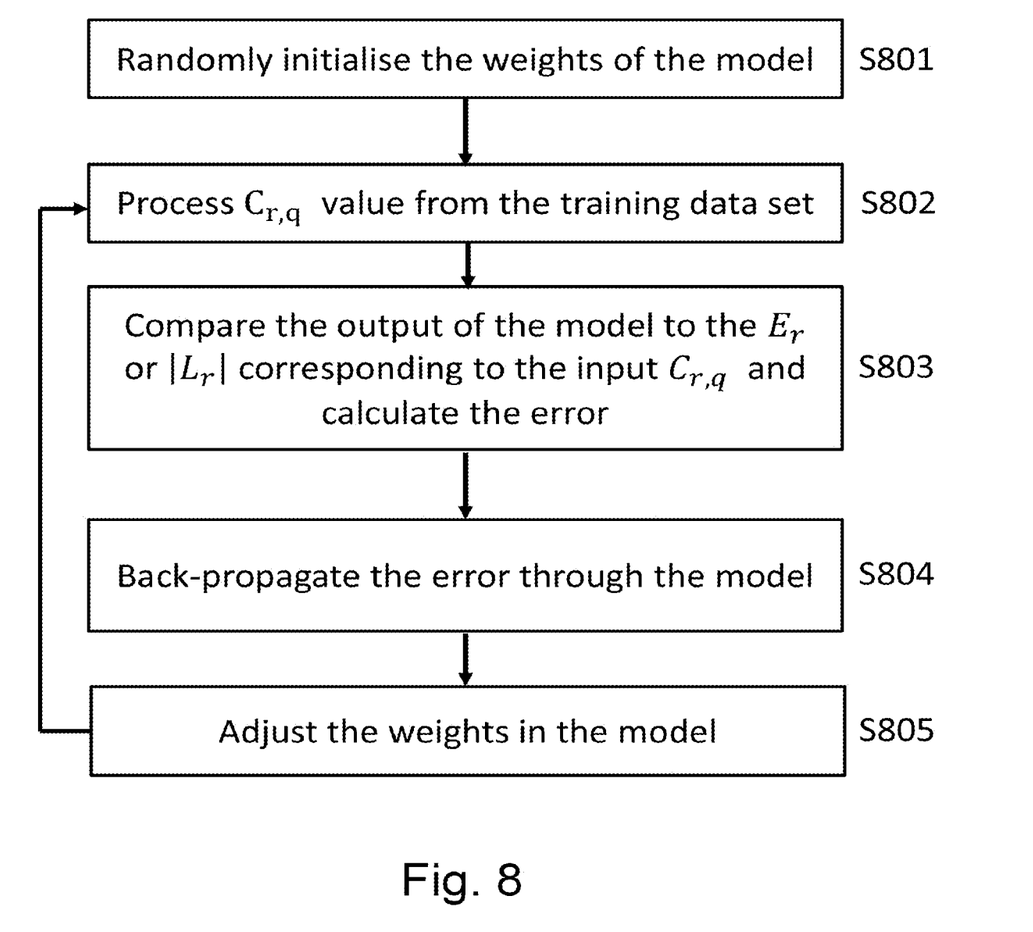
FIG. 8 is a flow chart showing an algorithm of an embodiment.

FIG. 7A illustrates a regression neural network according to an embodiment. The neural network comprises an input layer, at least one hidden layer and an output layer. The input to the neural network may be a vector of dimension n comprising the training data set values $C_{r,q}$. Alternatively, the training data set values ($C_{r,q}$) may be normalised or otherwise processed or reshaped before being used as an input to the neural network. In the network of FIG. 7A, the LLR magnitude $|L_r|$ is treated as a continuous number (not a member of a discrete set), so this is the output of the neural network. This is a regression problem. When the input is provided to the network, the parameters of the neural network are adjusted to minimise the loss between the output and the target (measured value of $|L_r|$). The loss function used could be, for example, mean-squared error (MSE). The output of the neural network is a continuous variable that is an estimate of the error count $\hat{E}_r$ or LLR magnitude $|\widehat{L_r}|$, FIG. 7B illustrates a classification neural network according to an embodiment. The neural network comprises an input layer, at least one hidden layer and an output layer. The input to the neural network may be a vector of dimension n comprising the training data set values $C_{r,q}$. Alternatively, the training data set values ($C_{r,q}$) may be normalised or otherwise processed or reshaped before being used as an input to the neural network. The LLR magnitude $|L_r|$ is quantised and treated as a discrete number. Since there are only a finite number of values the LLR magnitude can take, the neural network will output which one is the most likely. This is called a classification problem. The parameters of the neural network are adjusted to minimise the loss between the output and the target. The loss function could be, for example, crossentropy. One advantage of the classification neural network could be that the estimated LLR values are already quantised and can be passed on to a fixed-point LDPC decoder. If regression is used, the neural network out is a continuous value and must be quantised to be passed on to a LDPC decoder. The output of the neural network is a discrete variable that is an estimate of the error count $\hat{E}_r$ or LLR magnitude $|\widehat{L_r}|$, FIG. 8 illustrates an example method of training a neural network according to an embodiment.

In S801, the weights of the neural network are randomly initialised.

In S802, the $C_{r,q}$ values are processed by the neural network by propagating the values in a feed-forward fashion.

In S803, the output of the neural network is compared to the $E_r$ or $|L_r|$ corresponding to the input $C_{r,q}$ and the error is calculated.

In S804, the error is then propagated back through the system and the weights are adjusted.

The error in the model is minimised by repeating steps S802 to S804 until the error is minimised and the output is acceptably close to the value of $E_r$ or $|L_r|$. In calculating the errors, a loss function is used, for example, mean-squared error (MSE) or crossentropy.

Depending on the training and the training dataset, a trained model is produced which on receiving a value of $C_{r,q}$, allows for either a value of $E_r$ or $|L_r|$ to be inferred.

Once the model is trained, the variables of the trained model are stored in the flash memory controller or another storage device. When the LLR needs to be produced, the counts $C_{r,q}$ are inputted to the model and the estimated error count $\hat{E}_r$ or LLR magnitude $|\widehat{L_r}|$, is produced. Hence, the training is offline and the model requires no updating when used in soft decoding.

Note that as the model has been trained for a range of operational circumstances, it doesn't matter what the current retention time or P/E cycle count of the memory device is. For example, referring back to FIG. 5, if data is read from a device which has is classified as being useful up to 3000 P/E cycles, and the current P/E cycle of the device is 2800 P/E cycles, then it may be expected that there is a degradation in performance. However, as the model has been trained across a wide range of values, the value of the P/E cycle does not need to be known to improve the estimate of $\hat{E}_r$ or $|\widehat{L_r}|$,. The model itself will have compensated for this. By training the model for a large range of inputs, it doesn't matter what the particular input is when it is used in estimation mode. This is similar to a model trained to recognise hand-written numbers; if it is trained for a wide variety of inputs, it should be able to detect any writing style.

As mentioned previously, the final LLR is formed as $L_r=(2\hat{b}-1)|L_r|$ where $\hat{b}$ is the hard decision on the bit and the reliability $|L_r|$ has been estimated by the machine learning.

The advantage of the proposed method compared to existing ones is that the complexity is significantly reduced. Instead of solving a complex optimisation problem, the error $\hat{E}_r$ or LLR magnitude $|\widehat{L_r}|$,, can be estimated by a pretrained network. This reduces complexity as well as latency in the performance of soft decoding.

This approach may also be used for joint detection of multiple cells, wherein several neighbouring cells are used to estimate the reliability of a particular bit. For instance, if cells i −1, i and i+1 are used to estimate the bit in cell i, the number of cells falling into the interval triplet $(r_{i-1}, r_i, r_{i+1})$ can be counted along with and how many unsatisfied parity checks bit i is connected to. Then the network would be trained with $C_{r_{i-1}, r_i, r_{i+1}, q}$ as input and $L_{r_{i-1}, r_i, r_{i+1}}$ or $E_{r_{i-1}, r_i, r_{i+1}}$ as the target. Once trained, the network can be used to estimate the reliability of detected bits.

It is also worth noting that this embodiment can also be used for irregular LDPC codes. If for instance there are two different variable node degrees, $d_{v_1}$, $d_{v_2}$, the count of $C_{r,q}$ could be split into two $C_{r,q_1}$, $C_{r,q_2}$, where $0 \leq q_1 \leq d_{v_1}$, $0 \leq q_2 \leq d_{v_2}$; this tuple would now be the input to the network while $E_r$ or $|L_r|$ is still the desirable output.

In the above embodiments, the training data is generated by performing tests on a real flash memory device. However, the training data may be generated by other means. For example, an AWGN channel a model or simulation of the flash memory running on a computer may be used. In this way, the training data could be generated much quicker than performing tests on a real device.

Figure 9:
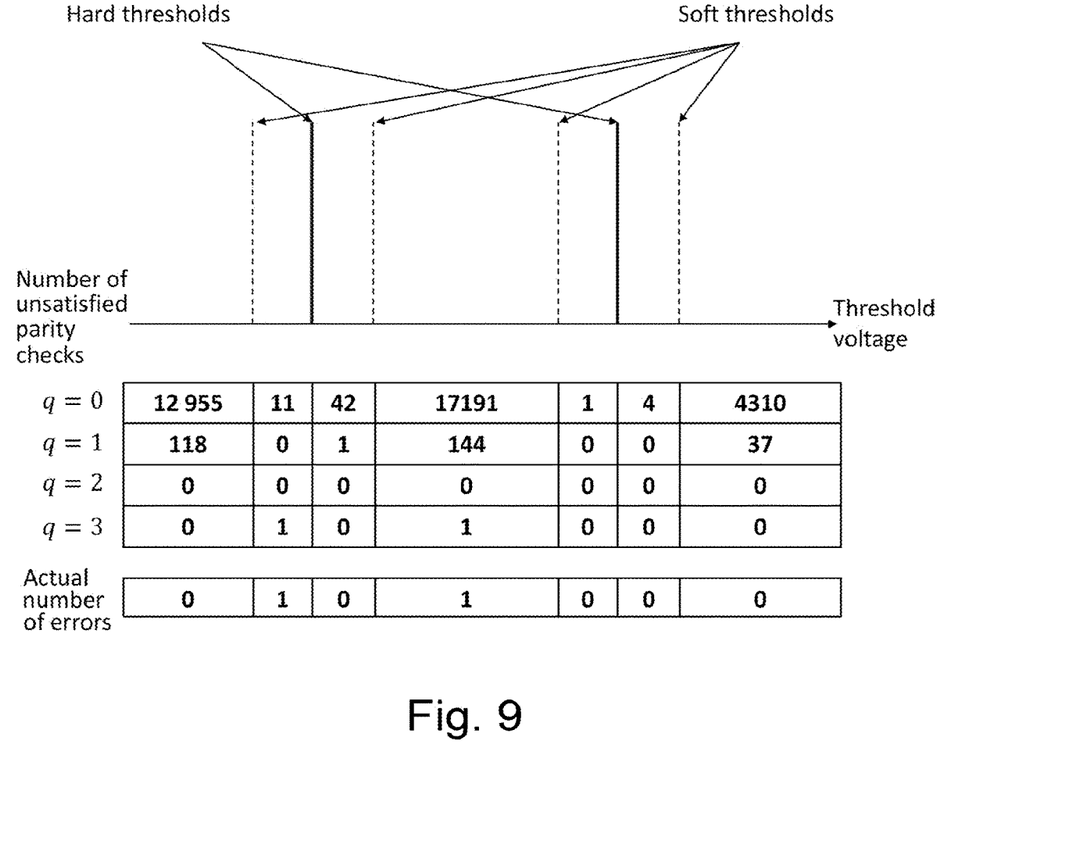
FIG. 9 illustrates a count according to an embodiment.

In FIG. 9 an example of how bits in each quantisation interval are counted is shown. Two hard reads (solid lines) are complemented with four soft reads (dashed lines), making a total of seven quantisation intervals. In this example, a total number of 34 816 cells were read and 2048 parity checks were computed. The information was arranged according to how many of the cells fell into a particular quantisation interval and how many unsatisfied parity checks each cell was connected to. The objective is then to estimate how many errors there were in each interval. Note that it is quite easy to estimate how many error there were in total, $\Sigma_{r=0}^6 L_r$, but their distribution is much more difficult. By training a model, this can be estimated with a high probability.

The hard decision is found from the quantisation interval. For instance, in FIG. 9 the first two intervals could be "−1" (left of the first hard threshold), the next three "+1" (between the hard thresholds) and the last two "−1" (right of the second threshold). The final LLR is then product of the hard decision (+/−1) and the estimated magnitude of the LLR (found by the neural network).

Note that the above methods do not necessarily have to be used in Flash Memory. The LLR estimation algorithm is mainly dependent on the LDPC code and can hence be used in other applications.

Figure 10:
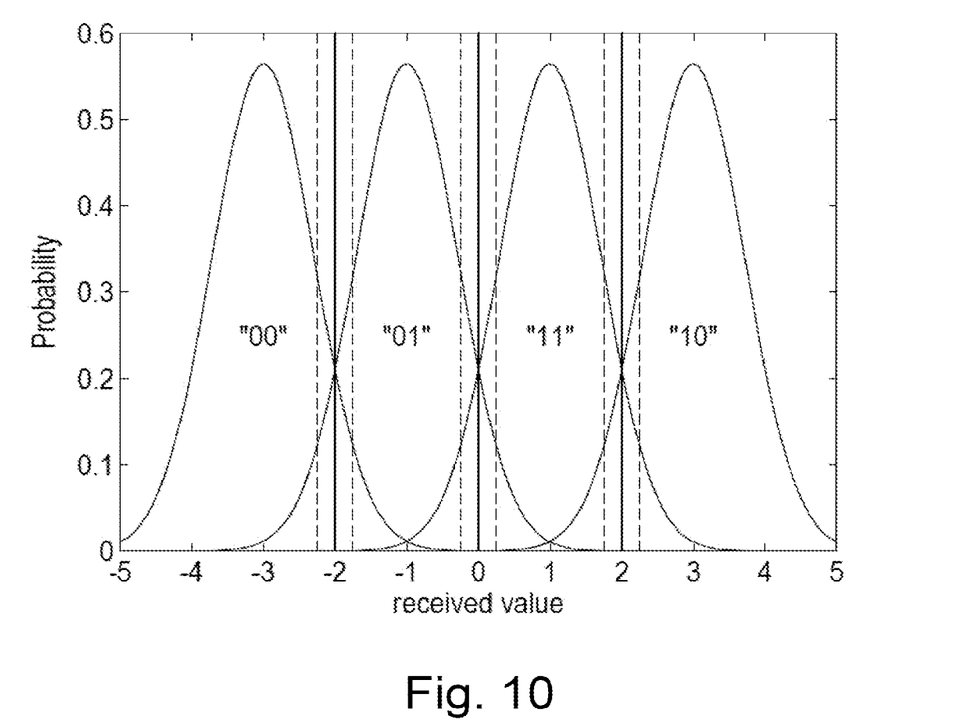
FIG. 10 shows possible distributions of receive signals of four pulse amplitude modulated signal values.

FIG. 10 shows the distributions of four signals received in a wireless amplitude modulated signal transmission method. As can be seen from FIG. 10, the signal distributions overlap in the same manner as discussed above with reference to data read from flash memory. The signal values received are floating point values that can be compared to the "hard decision" boundaries shown in solid lines between the signal distributions in FIG. 9. One or more soft decision boundaries (shown in dashed lines in FIG. 9) are further defined on either side of one or more of the hard decision boundaries, similar to the threshold values $V_{S1}$ to $V_{S4}$ shown in FIG. 3B, and the received floating point values are compared to these boundaries. The log likelihood values can then be calculated in the same manner as discussed above. In this case, the training data set may be acquired by sending known data for a range of wireless system states and operating conditions. The errors $E_T$ can then be counted as detailed above.

The commonly used QAM (Quadrature Amplitude Modulation) uses to separate pulse amplitude modulated symbols that can be decoded independently from each other in the above described manner.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A method of soft decoding received signals, the method comprising:
    defining quantisation intervals for a signal value range;
    determining a number of bits in each quantisation interval that are connected to unsatisfied constraints;
    providing, the number of bits in each quantisation interval that are connected to unsatisfied constraints, as an input to a trained model, wherein the trained model has been trained to cover an operational range of a device for soft decoding of signals;
    determining, using the trained model, a log likelihood ratio for each quantisation interval; and
    performing soft decoding using the log likelihood ratios.

2. A method according to claim 1, wherein the device is a flash memory device, and the trained model has been trained on a dataset acquired for a range of data retention intervals, program/erase cycles, read/disturb values and temperature values for the flash memory device.

3. A method according to claim 1, wherein determining the log likelihood ratio for each quantisation interval comprises:
    inferring, from the trained model, a magnitude of a log likelihood ratio for each quantisation interval; and
    calculating, using the magnitude of the log likelihood ratio, the log likelihood ratio in each quantisation interval.

4. A method according to claim 1, the method further comprising:
    determining a number of bits in each quantisation interval,
    wherein determining the log likelihood ratio for each quantisation interval comprises:
        inferring, from the trained model, an error in each quantisation interval; and determining a magnitude of a log likelihood ratio for each quantisation interval based on the error and the number of bits detected in each quantisation interval; and calculating, using the magnitude of the log likelihood ratio, the log likelihood ratio in each quantisation interval.

5. A method according to claim 1, wherein the trained model is a neural network.

6. The method of claim 1, further comprising outputting the soft decoded data from a controller that has performed said soft decoding to an output port or to a connected device.

7. A non-transitory storage medium storing computer program instructions for execution by a processor and that, when executed by a processor, cause the processor to perform the method of claim 1.

8. A device for soft decoding received signals comprising a processor and memory storing instructions for execution by the processor, the instruction causing the processor when executing the instruction to:

define quantisation intervals for a signal value range;

determine a number of bits in each quantisation interval that are connected to unsatisfied constraints;

provide, the number of bits in each quantisation interval that are connected to unsatisfied constraints, as an input to a trained model wherein the trained model has been trained to cover an operational range of a device for soft decoding of signals;

determine, using the trained model, a log likelihood ratio for each quantisation interval; and perform soft decoding using the log likelihood ratios.

9. A device according to claim 8, wherein the device is a flash memory device, and the trained model has been trained on a dataset acquired for a range of data retention intervals, program/erase cycles, read/disturb values and temperature values for the flash memory device.

10. A device according to claim 8, wherein determine the log likelihood ratio for each quantisation interval comprises:

infer, from the trained model, a magnitude of a log likelihood ratio for each quantisation interval; and calculate, using the magnitude of the log likelihood ratio, the log likelihood ratio in each quantisation interval.

11. A device according to claim 8, the instructions causing the processor when executing the instruction to:

determine a number of bits in each quantisation interval, wherein determine the log likelihood ratio for each quantisation interval comprises:

infer, from the trained model, an error in each quantisation interval; and determine a magnitude of a log likelihood ratio for each quantisation interval based on the error and the number of bits detected in each quantisation interval; and calculate, using the magnitude of the log likelihood ratio, the log likelihood ratio in each quantisation interval.

12. A device according to claim 8, wherein the trained model is a neural network.

13. The device of claim 8, the instruction causing the processor when executing the instruction to output the soft decoded data from a controller that has performed said soft decoding to an output port or to a connected device.

14. The device of claim 8, wherein the device is a flash memory storage device.

15. The device of claim 8, wherein the device is a wireless communications device.

* * * * *